(12) United States Patent
Zwayer

(10) Patent No.: US 11,642,737 B2
(45) Date of Patent: May 9, 2023

(54) SYSTEM AND METHOD FOR INDUCTANCE COMPENSATION IN A WELDING-TYPE SYSTEM

(71) Applicant: Illinois Tool Works Inc., Glenview, IL (US)

(72) Inventor: Jake Zwayer, Appleton, WI (US)

(73) Assignee: Illinois Tool Works, Inc., Glenview, IL (US)

( * ) Notice: Subject to any disclaimer, the term of this patent is extended or adjusted under 35 U.S.C. 154(b) by 639 days.

(21) Appl. No.: 15/658,727

(22) Filed: Jul. 25, 2017

(65) Prior Publication Data
US 2019/0030633 A1 Jan. 31, 2019

(51) Int. Cl.
| | |
|---|---|
| *B23K 9/095* | (2006.01) |
| *B23K 9/10* | (2006.01) |
| *G01R 31/58* | (2020.01) |
| *B23K 9/32* | (2006.01) |
| *B23K 9/133* | (2006.01) |

(52) U.S. Cl.
CPC .......... *B23K 9/0953* (2013.01); *B23K 9/0956* (2013.01); *B23K 9/1006* (2013.01); *B23K 9/133* (2013.01); *B23K 9/32* (2013.01); *G01R 31/58* (2020.01)

(58) Field of Classification Search
None
See application file for complete search history.

(56) References Cited

U.S. PATENT DOCUMENTS

| | | | | |
|---|---|---|---|---|
| 4,697,758 A | * | 10/1987 | Hirose | A01K 89/015 242/223 |
| 8,455,794 B2 | * | 6/2013 | Vogel | H02M 3/157 219/130.21 |
| 9,375,244 B2 | * | 6/2016 | Orszulak | A61B 18/14 |
| 9,506,958 B2 | * | 11/2016 | Davidson | G01R 19/2506 |
| 2013/0015284 A1 | * | 1/2013 | Tracey | B65H 75/4484 242/390.2 |
| 2013/0306610 A1 | * | 11/2013 | Chantry | B23K 9/1056 219/130.01 |
| 2015/0283652 A1 | * | 10/2015 | Pfeifer | B23K 9/0953 219/130.21 |

FOREIGN PATENT DOCUMENTS

| | | | |
|---|---|---|---|
| JP | 2012 152805 | * | 8/2012 |
| JP | 2012-152805 | * | 8/2012 |

* cited by examiner

*Primary Examiner* — Ibrahime A Abraham
*Assistant Examiner* — Elizabeth M Kerr
(74) *Attorney, Agent, or Firm* — McAndrews, Held & Malloy, Ltd.

(57) ABSTRACT

Systems and methods for inductance compensation in a welding-type system include a reel configured to wind a welding-type cable to reduce a first portion of the welding-type cable extending from the reel, and to unwind to increase the first portion of the welding-type cable extending from the reel, wherein a second portion of the welding-type cable is at least partially wound around the reel when stored. A controller determines a first length of the first portion of the welding-type cable, calculates a first inductance of the first portion of welding-type cable extending from the reel based on the first length, determines a second length of the second portion of the welding-type cable, calculates a second inductance of the second portion of welding-type cable wound around the reel based on the second length, and calculates a cable inductance of the welding-type cable based on the first inductance and the second inductance.

20 Claims, 5 Drawing Sheets

SYSTEM AND METHOD FOR INDUCTANCE COMPENSATION IN A WELDING-TYPE SYSTEM

BACKGROUND

Welding systems often employ welding-type cables to supply power and/or carry information to and from welding-type tools (e.g., a welding torch, a plasma cutter, etc.) and/or accessories (e.g., a wire feeder, an induction heater, etc.). Industries that require on-site welding (e.g., the pipeline and construction industries) employ welding power sources with welding-type cables connecting a welding-type tool. For instance, a length of welding-type cable is connected on one end to the welding power source (e.g., a welding-type power supply), with a second end connected to the welding-type tool. The tool is then brought to the work area.

Often, the unwound cable is exposed to the environment (e.g., a work site, a shipyard, an industrial setting, etc.), which can cause damage to the cable. The cable may also be folded or coiled in a manner which causes kinks, which may lead to damage to the cable, especially in a multi-function welding-type cable. Storage of long welding-type cables may be implemented by rolling, winding, folding, or other means of transporting and attaching the cable to a portable reel (e.g., wrapping the work cable around the power supply, the shielding gas cylinder, etc.).

In certain work environments a welding location or workpiece can be located a long distance from a welding power source. When current flows through a welding cable an inductance created therein can adversely affect the operation of the welding system and the quality of the weld obtained. Thus, a system to calculate and mitigate such secondary inductance is desirable.

SUMMARY

Apparatus and methods are disclosed for inductance compensation in a welding-type system. In particular, disclosed example welding-type systems are configured to determine an inductance value of a welding-type cable based on a length measurement of the cable and to adjust a parameter of the welding-type system in response to the determined inductance, in accordance with aspects of this disclosure.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1:
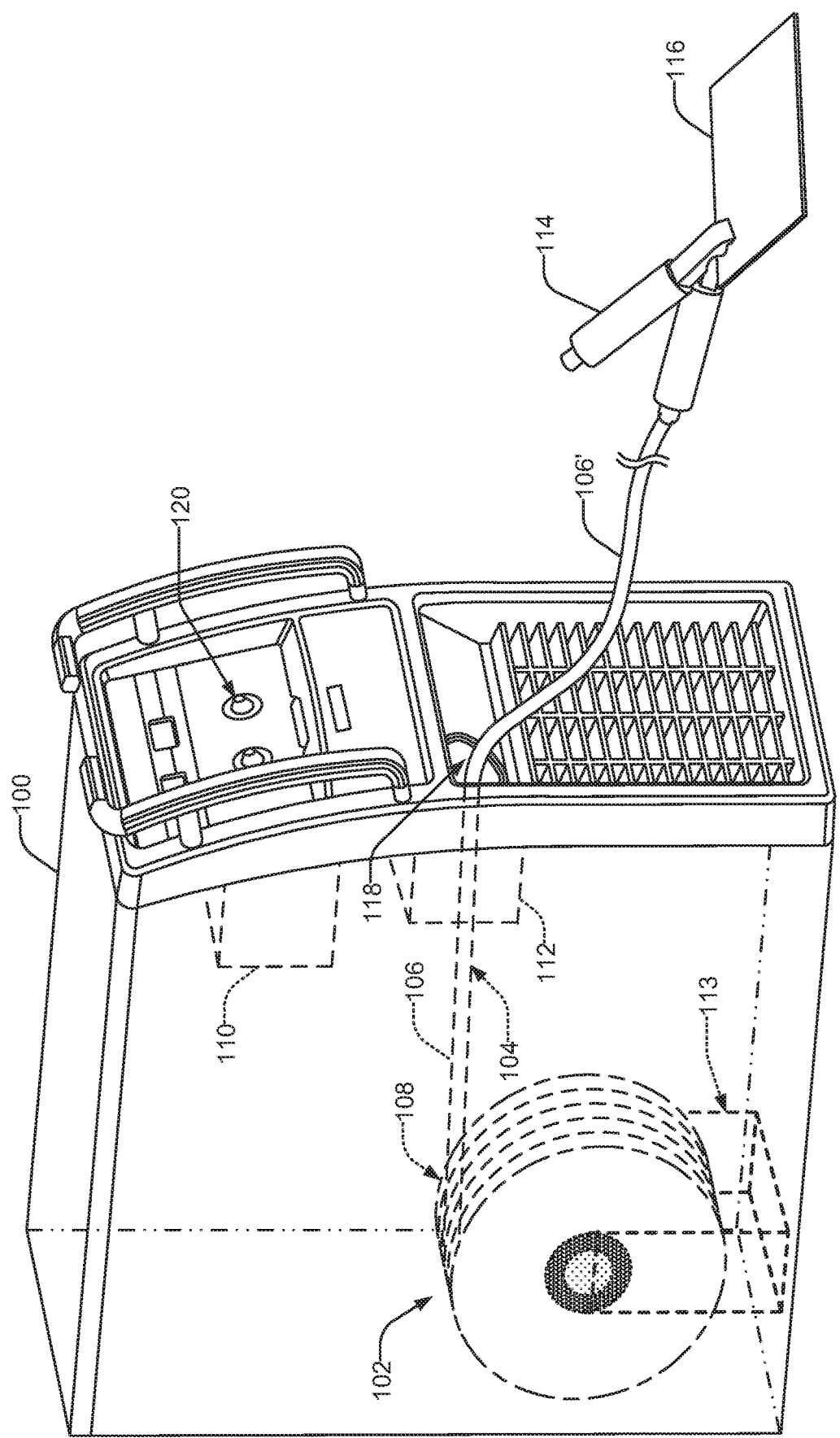
FIG. 1 illustrates an example welding-type power supply configured to calculate inductance in accordance with aspects of this disclosure.

In examples disclosed herein, a welding-type system is configured to determine an inductance value of a welding-type cable and adjust a parameter of the welding-type system in response to the determined inductance. For example, properties that affect the inductance of the weld power cable may include the total length of the cable, the materials that make up conductors within the weld power cable (e.g., power conductors, data carriers, gas and/or wire guides, etc.), disposition of the weld power cable (e.g., coiled, straight), disposition relative to conductive materials (e.g., coiled around a metal rod, gas canister, etc.), arrangement relative to other power cables (e.g., parallel to, twisted about, etc.), and proximity to inductive sources (e.g., other power cables).

In some examples, the cable can be wound around an object (e.g., a reel) such that a first length of the cable is parallel to a second length of the cable (see, e.g., the wound portion). As a current is applied to the cable, a magnetic field is generated in each of the parallel cables. The magnetic field from the first length will influence the inductance in the second length, increasing the inductance. The increased inductance requires an increased power output from the power supply to achieve the same level of power output at the welding tool.

Example welding-type systems disclosed herein are configured to determine and mitigate an inductance in the welding-type cable. In particular, the welding-type system includes a reel configured to wind a welding-type cable during storage and unwind the cable for use. The system determines if a portion of the welding-type cable is at least partially wound around the reel when stored. In some examples, a controller is configured to determine a length of the portion of the welding-type cable extending from the reel, such as by one or more sensors to measure a length of the extended portion (e.g., an optical scanner, a mechanical length measuring device, etc.) and based on predetermined parameters (e.g., a predetermined value of the total cable length, a power input value, etc.).

Based at least in part on the determined length of the extended portion, the controller calculates an inductance value of the extended portion of welding-type cable reel. For example, the controller can be configured to consider a number of parameters, such as the type of cable in use, welding process, amount of power/voltage/current being output, system and/or environmental temperature, to name only a few. Based on the calculated and known parameters, the controller is configured to calculate the inductance of the extended portion of the welding-type cable.

Based at least in part on the determined length of the extended portion, the controller determines a length of the portion of the welding-type cable wound around the reel (e.g., by subtracting the length of the extended portion from the value of the total cable length, by identification of a marking along a length of the cable, etc.). The controller then calculates an inductance of the portion of welding-type cable wound around the reel based on the length, and known and calculated parameters.

Based at least in part on the calculated inductance of the wound and unwound portions of the welding-type cables, the controller is then configured to calculate an inductance of the total welding-type cable based on the first inductance and the second inductance.

In some examples, the controller includes a memory device that includes a plurality of values that associates a length of the portion of the cable wound around the reel with corresponding inductance values. The values can be calculated based on known or estimated values corresponding to a diameter of the reel, a width of the reel, a diameter of the cable, a power/voltage/current output through the cable, the welding process, etc. Based at least in part on these values, the number of coils about the reel can be calculated or estimated. An inductance of the portion of the cable about the reel, based on the number of turns, the input, etc., can then be determined. The values can be stored as a matrix or look-up table, for instance.

The controller is further configured to access the memory device to determine the inductance of the wound portion by looking up the length of the second portion of the welding-type cable as provided by the values.

Having determined the inductance value associated with the cable, the controller is further configured to control a welding parameter or welding system parameter of the welding-type system based on the calculated cable inductance. For example, as the inductance value increases, in order to maintain a desired output at the welding-type torch, the power/voltage/current input (e.g. from the power supply) may be required to increase. A welding system parameter may also be measured, compared and adjusted. As such, operation of a control loop, such as the rate of the loop, can be adjusted based on monitored system parameters. Thus, if the inductance value exceeds a threshold amount, the controller may control an output or operation of the system to mitigate the effects of the increased inductance.

As used herein, the term "welding-type power" refers to power suitable for welding, plasma cutting, induction heating, CAC-A and/or hot wire welding/preheating (including laser welding and laser cladding). As used herein, the term "welding-type power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuitry and other ancillary circuitry associated therewith.

As used herein, a "circuit" (e.g., controller, control circuit, etc.) includes any analog and/or digital components, power and/or control elements, such as a microprocessor, digital signal processor (DSP), software, and the like, discrete and/or integrated components, or portions and/or combinations thereof.

FIG. 1 is an example welding-type power supply 100 which incorporates a retractable cable reel 102. The reel 102 is configured to wind and unwind a cable 104. A portion of the cable 106 can extend from the reel 102 and through an opening 118 (the portion outside of the power supply 100 represented as cable 106') of the power supply 100, and connect with a welding-type tool 114 (e.g., a welding-type torch, a plasma cutter, induction heating device, work clamp, etc.). Another portion 108 of the cable 104 is wound around the reel 102 and stored until needed.

In examples, the reel 102 is connected to a power input of the power supply 100 via an electrical connector, which can include a slip-ring, a brush contact, or other conductive member that allows current to flow during rotation of the reel 102.

The wound portion 108 is repeatedly extended and retracted through the opening 118 during and after each use. In some examples, the reel 102 can be mounted within the housing of the welding-type power supply 100, and be configured to rotate as the cable 104 is wound and unwound. For example, the cable 104 can be partially stored on the reel 102 and pass through the opening 118. The cable 104 can be withdrawn from the housing by pulling on the cable 104, by turning a crank, by a motorized method, or other suitable means.

As the unwound portion 106, 106' of the cable 104 is extended/retracted, a sensor 112 can be located along the cabling path, such as at the opening 118. The sensor 112 can be configured to measure the length of the cable 104, such as measuring the amount of cable that is unwound (portion 106, 106'). The sensor 112 can be, for example, a tachometer, a digital or an analog rotary encoder, a mechanical length measuring meter, an optical scanner, or other suitable sensor. For example, the digital or analog rotary encoder can be configured to count a number of revolutions of the reel based on a length of the cable 104 passing the sensor 112 during winding and unwinding of the welding-type cable.

In some examples, the mechanical length measuring meter can be configured to measure the length of the extended cable portion 106, 106' during winding and unwinding of the welding-type cable. The measurement can be used to calculate the amount of cable 108 remaining on the reel 102, in view of known and/or calculated and/or estimated parameters such as total length of the cable 104, circumference of the reel 102, the diameter of the cable 104, for instance.

Figure 2:
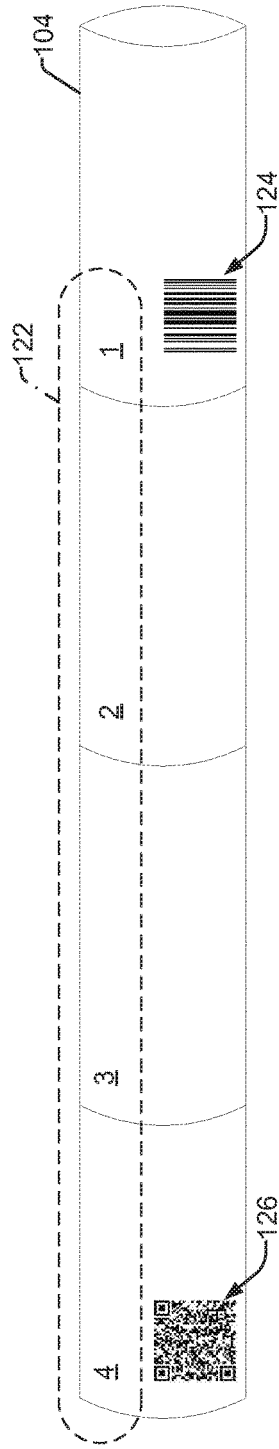
FIG. 2 illustrates an example cable for use in a welding-type system in accordance with aspects of this disclosure.

Additionally or alternatively, the sensor 112 can be configured to recognize a pattern or series of marks along the length of the cable 104, as shown in FIG. 2. For example, a number of marks 122 can be located along the length that indicates a unit of measure (e.g., a marking at every meter, foot, etc.). In some examples, the cable 104 may have the length marked at different intervals, similar to a common ruler. In other examples, the markings can be a recognized pattern, such as a bar code 124, QR code 126, or other scannable information that allows the sensor 112 to determine the length of cable 104 unwound from the reel 102. Additionally or alternatively, the markings can indicate information about the cable 104. The information can include a total length and/or weight of the cable 104, a unit length and/or weight of the cable 104, an inductance value per length of a straight portion of the cable 104, or other information useful in determining the inductance of the cable 104.

Returning to FIG. 1, the controller 110 can receive a signal from the sensor 112 indicating a length of wire 106, 106' unwound from the reel 102. Based on a total length of the cable 104, the controller 110 calculates the length of the unwound portion 106, 106', which can be used to determine an inductance of the wound portion 108. This inductance value can be used to adjust an output of the power supply 100 (e.g., a voltage, a current, etc.) to mitigate the effects of inductance on the welding-type operation.

Operation of the power supply 100 can be governed by use of one or more interfaces 120. The interface 120 can provide commands, display and communication with one or more devices. In some examples, the interface 120 can adjust and/or monitor operational settings by a modified and/or configurable user interface. In an example, a button can be used to select a welding operation, which can then be adjusted (e.g., with a dial, a touch panel, a membrane switch, etc.). The interface 120 can provide alerts and or information, such as an indication as to the selected welding-type operation, a power output value, and calculated inductance, or other useful information.

As illustrated in FIG. 1, the interface 120 may be on a control panel integrated with the power supply 100. The interface 120 can include one or more switches and/or buttons, each having a singular and/or multi-purpose function. In some examples, the interface 120 can operate a motor powering the reel 102. For instance, a user can initiate an automatic rewinding of the cable 104 onto the reel 102 by activating the motor. A motor control can be configured to adjust the speed and/or torque applied to the reel 102 as the cable 104 is retracted. In an example, the interface 120 can communicate with a remote interface.

Cord management systems, such as the reel 102, can be integrated with the power supply 100 allowing the cable 104 to be neatly wound around the reel 102 in an enclosed housing when the cable 104 is not in use. In some examples, the reel 102 is mounted on a frame 113 directly inside a welding-type power supply 100. An additional sensor can be included with the frame 113, configured to measure a weight of the reel 102 and the wound portion 108 of the cable 104 (see, e.g., weight sensor 144 of FIG. 3). Based on the known and/or calculated and/or estimated weight of the reel 102, a weight of the wound portion 108 can be determined. Based on the determined weight, an amount of cable 108 about the reel 102 can be calculated. Thus, the number of turns about a reel 102 of a particular diameter can be determined, which can be used to determine an inductance value of the wound portion. For example, a list of values can be stored in the memory that associated weight measurements of the wound portion 108 a length of the wound portion 108 can be calculated.

In an example, the reel 102 can include a spring to provide the force needed to rotate the reel 102 and thereby retract the cable 104 back into the power supply 100. The addition of multiple or stronger springs can increase the tension for certain applications that use large or heavy cables. In some examples, the spring can be made of spiral spring made of a resilient material, such as steel. An extension connector can be attached to an end of the cable 108 to prevent the entirety of the cable 108 from retracting into the housing, as well as provide for connectivity to a variety of welding-type tools 114 (e.g., a work clamp). In some examples, the reel 102 is spring driven, which will allow for the reel 102 to automatically rewind. The reel 102 features a locking ratchet that allows for a certain amount of the cable 104 to be pulled from the system without the cable 104 being pulled back onto the reel 102. The cable reel 102 provides a current path through a conductor (e.g., a slip ring) that allows the current to travel from the welding-type power supply to a welding-type tool (e.g., a welding torch).

In an example, the reel 102 features a locking ratchet that allows for a certain amount of the cable 104 to be pulled from the system without the cable 104 being pulled back onto the reel. The locking ratchet further allows retraction of the cable 108 into the housing upon release of the locking ratchet. In some examples, a motor can cause the reel 102 to wind and/or unwind, allowing the cable portion 106, 106' to extend from the power supply 100. In an example, the reel 102 is mechanically connected to a manual device which can be used to wind and unwind the cable 104. The manual device can be a crank or other type of turn, which may not automatically rewind the cable 104. In a situation where an override function is needed, the manual device can allow for extraction and/or retraction of the cable 104 when, for example, no power is available for a motorized retractor.

Thus, the disclosed reel 102 can include a retractable cord system that is durable and can withstand high operational use, such as repeated winding and unwinding of the welding-type cable 104. The reel 104 can be compact, integrated with other welding-type systems (e.g., a welding-type power supply) which reduces clutter and the need for multiple devices. As such, the cable 104 should be constructed to withstand the amount of force needed to withdraw the cable 104 from the welding-type power supply 100 without damaging or breaking the cable 104.

In some examples, the construction of the connector can be customized to provide for power, gas, wire, and/or other welding-type inputs and consumables (e.g., for FCAW welding, a cable with an integrated gas line, etc.). In other examples, the retractable cable management system can be used for a variety of cables/tubing/cords, etc. For example, a cable that includes tubing may need to be wound in a large loop to avoid damage to the wire, such as kinks, during winding and unwinding. In some examples, the retractable system can be used to wind and unwind a gas line, a ground cable, or other types of welding-type cables.

In some examples, the power supply 100 can include both a welding-type cable for a torch as well as a power return cable connected to a work clamp (not shown), with each configured to be stored on separate reels within the power supply 100. Additionally or alternatively, each cable can be further connected to another reel (not shown) to extend the reach and capability of the retractable cable system. Moreover, an integrated and/or external reel may provide power and/or control signals to accessories to the power supply 100 (e.g., a wire feeder, a heating unit, etc.).

Although illustrated in a welding-type power supply, the controller and reel system described herein can be integrated into a variety of portable welding-type systems, such as in a welding-type cart, a rack system, a wire feeder, or other suitable housing. In some examples, a stand-alone "smart" reel can be mounted remotely from a welding-type power supply. A reel can be mounted to a vehicle or other surface or object on or near a job site. The reel can include sensors and components as described with respect to reel 104, and communicate with the welding-type power supply by a wired or wireless connection. Via the connection, information and/or power can be exchanged between the reel and the welding-type power supply to determine an inductance value for the cable, as described herein.

Figure 3:
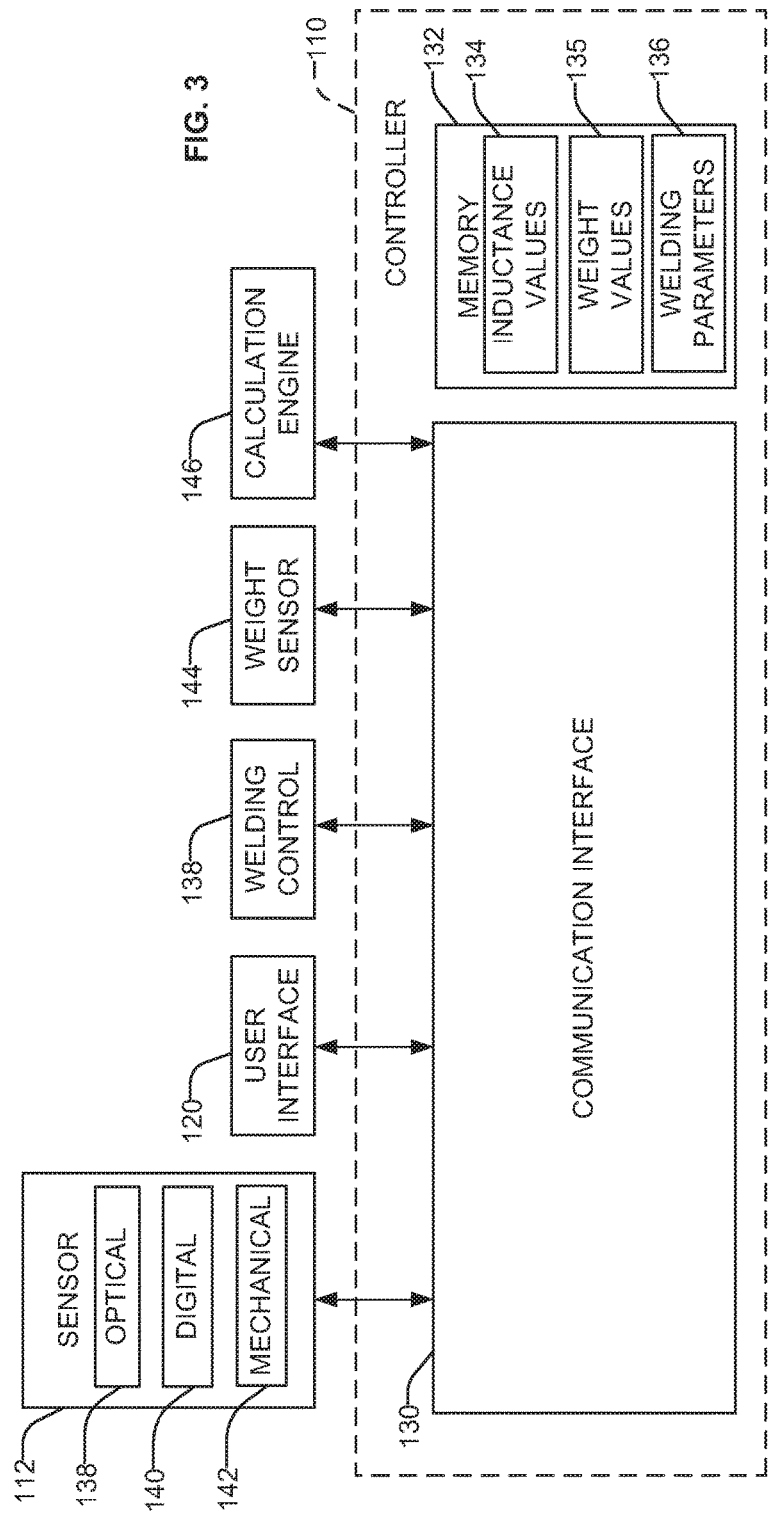
FIG. 3 is a block diagram of an example implementation of a controller of a welding-type system, in accordance with aspects of this disclosure.

FIG. 3 shows a block diagram of an example implementation of the controller 110 of FIG. 1. The controller 110 includes a communication interface 130 to transmit information to and receive information from one or more devices. The interface 130 is operatively connected to the user interface 120, a welding control 138, a calculation engine 146, a weight sensor 144, and the sensor 112 (e.g., a length measurement sensor). The controller 110 further includes a memory 132 which contains a matrix or other listing of inductance values 134, a matrix or other listing of weight values 135, as well as a matrix or other list of welding parameter values or welding system parameter values 136.

As described herein, the controller 110 communicates with the user interface 120, the calculation engine 146, the weight sensor 144, and the sensor 112 to determine an inductance of the cable 104, and controls the power supply 100 via the welding control 138 accordingly. The example controller 110 of FIG. 3 may be a general-purpose computer, a laptop computer, a tablet computer, a mobile device, a server, and/or any other type of computing device integrated or remote to the power supply. In some examples, the controller 110 is implemented in a cloud computing environment, on one or more physical machines, and/or on one or more virtual machines.

The controller 110 may receive input from the user interface 120 through which the power supply 100 receives commands from, for example, an operator (e.g., a welder). In some examples, the operator may employ the user interface 120 to choose a welding process (e.g., stick, TIG, MIG, etc.) and desired operating values of the power supply 100 (e.g., output power, voltage, current, etc.). The user interface 120 can be configured for inputting commands and/or customizing controls (e.g., graphical user interfaces (GUI), touch screens, communication pathways, etc.). The controller 110 may be configured to receive and process a plurality of inputs regarding the performance and demands of the power supply 100. As described herein, information received from the interface 120 and other inputs can be used to determine an inductance value of the cable 104.

The memory device 132 may include volatile or non-volatile memory, such as ROM, RAM, magnetic storage memory, optical storage memory, or a combination thereof, and may be integrated with the controller 110, located remotely, or a combination of the two. In addition, a variety of control parameters may be stored in the memory device 132 along with code configured to provide a specific output during operation.

For example, the controller 110 is configured to access the memory 132 storing the lists of values 134, 135, 136. In some examples, the controller 110 and the memory 132 are integrally located (e.g., within a computing device). In some examples, the controller 110 is connected to a network interface to access the lists of values 134, 135, 136 via a communications network.

The controller 110 is configured to receive one or more measurements to determine an inductance of the weld cable 104. For example, the sensor 112 measures a length of the cable 106, 106' extending from the power supply 100. The sensor 112 can include an optical sensor 138, a digital sensor 140, and/or a mechanical sensor 142, each of which can measure and/or determine a length of the cable 106, 106' as it extends through the opening 118. In some examples, the optical sensor 138 and/or the digital sensor 140 can identify a bar code 124, QR code 126, or other marker 122 to determine the length of the cable 106, 106', as well as other information. The mechanical sensor 142 can be a rotary or other type of sensor that measures cable length by physical contact or connection to gears coupled to the reel 102. In any case, the length measurement information is sent to the controller 110 via the communication interface 130 for processing.

The length measurements are provided to a calculation engine 146 to determine the length of the cable 108 wound around the reel 102. The controller 110 compares the length values against a list of inductance values 134 stored in the memory 132. Based on the comparison, the controller 110 can determine an inductance of both the extending portion of the cable 106, 106' and the wound portion of the cable 108. The calculation engine 146 can thus calculate the total inductance of the cable 104.

In another example, the controller 110 receives a weight measurement from the weight sensor 144 included in the frame 113. The controller 110 compares the weight values against a list of weight values 135 stored in the memory device 132 that corresponds weight values to inductance values.

Having determined the inductance of the cable 104, the controller 110 can then compare the inductance value against a matrix or other list of welding parameters or welding system parameter values 136. For example, the controller 110 may utilize a look up table, an algorithm, and/or a model stored in the memory device 132 to determine the cable inductance based on a relationship between the variables and the values stored in memory 132. The controller 110 can compare the determined welding parameter or welding system parameter against a welding parameter or welding system parameter of the power supply 100, and determine if an adjustment is needed. For example, if the determined welding parameter deviates from a welding parameter of the power supply 100 by a predetermined amount, the welding parameter of the power supply 100 can be adjusted to mitigate the effects of the inductance and ensure proper operation of the power supply 100. The controller 110 can then adjust a welding parameter in accordance with the determined inductance value to control the power supply 100.

In some examples, for known cable inductances, certain welding parameters can be estimated, such as output and input, voltage and current levels, or a range of levels. Based on these estimated welding parameters, any adjustment of a welding operation can be determined empirically. In some examples, the controller 110 is configured to interpolate an inductance value for the cable 104, the corresponding welding parameter values selected based on the value of the inductance value. The welding parameter can then be adjusted to mitigate the effects of the inductance as described herein.

Figure 4A:
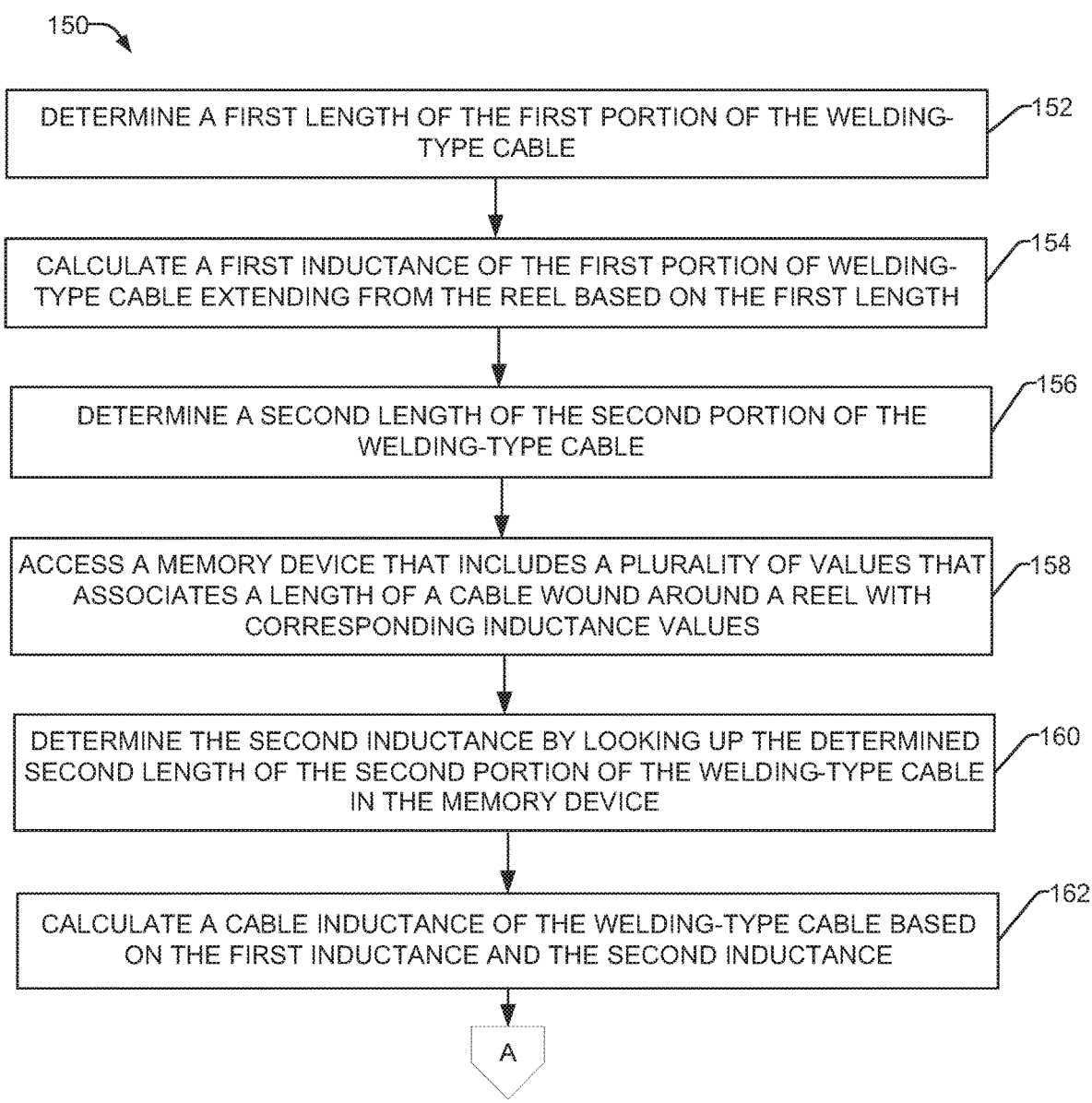
FIGS. 4A and 4B illustrate an example method of calculating cable inductance in a welding-type system in accordance with aspects of this disclosure.
Figure 4B:
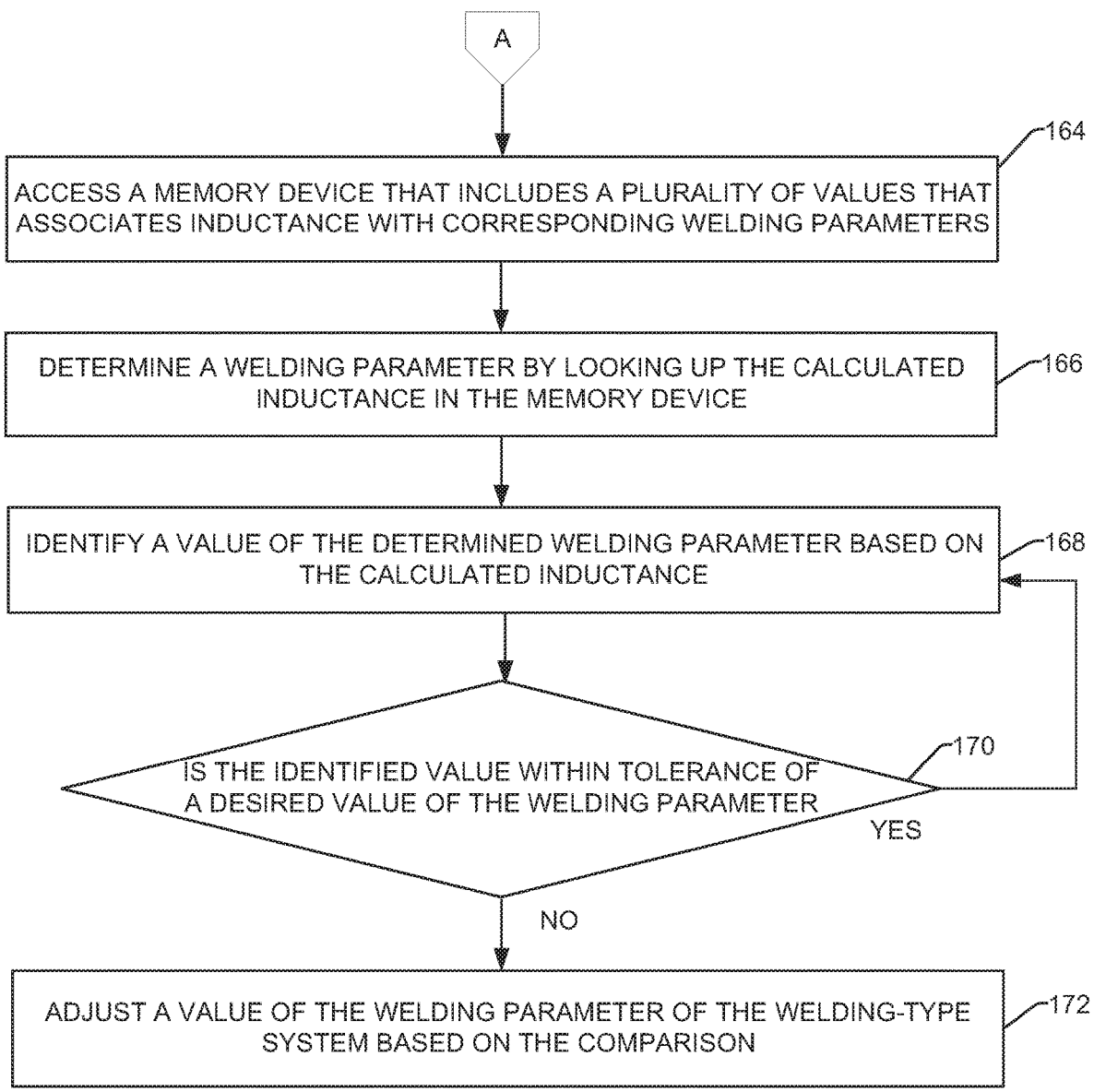

FIGS. 4A and 4B represent a flowchart illustrating example machine readable instructions 152 which may be executed by the controller 110 of FIG. 3 to determine the inductance of a welding-type cable 104 and adjusting a welding type parameter of a welding type system 100, in accordance with the examples provided in FIGS. 1-3. In examples, the instructions 152 can be stored in the memory 132. In the example of FIG. 4A, at block 152 a first length of the first portion 106 of the welding-type cable 104 extending from the reel 102 is determined. At block 154, a first inductance of the first portion 106 of welding-type cable based on the first length is calculated. At block 156, a second length of the second portion 108 of the welding-type cable is determined based on the first length. At block 158, a memory device 132 that includes a plurality of values 134 that associates a length of a cable 108 wound around a reel 102 with corresponding inductance values is accessed. At block 160, the second inductance by looking up the determined second length of the second portion in the memory device is determined. At block 162, a cable inductance of the welding-type cable 104 based on the first inductance and the second inductance is calculated.

Continuing with FIG. 4B, at block 164 the memory device 134 that includes the plurality of values associating inductance with corresponding welding parameters or welding system parameter values 136 is accessed. At block 166, a welding parameter or welding system parameter is determined by looking up the calculated inductance in the memory device 132. At block 168, a value of the determined welding parameter or welding system parameter is identified based on the calculated inductance. At block 170, the controller 110 determines whether the identified value falls within a tolerance of a desired value of the welding parameter or welding system parameter. At block 172, a value of the welding parameter or welding system parameter of the welding-type system 100 is adjusted if the comparison determines the identified welding parameter or welding system parameter is outside of the tolerance. If the identified welding parameter or welding system parameter is within the tolerance, the method returns to block 168 and continues to identify the welding parameters or welding system parameters.

Figure 5:
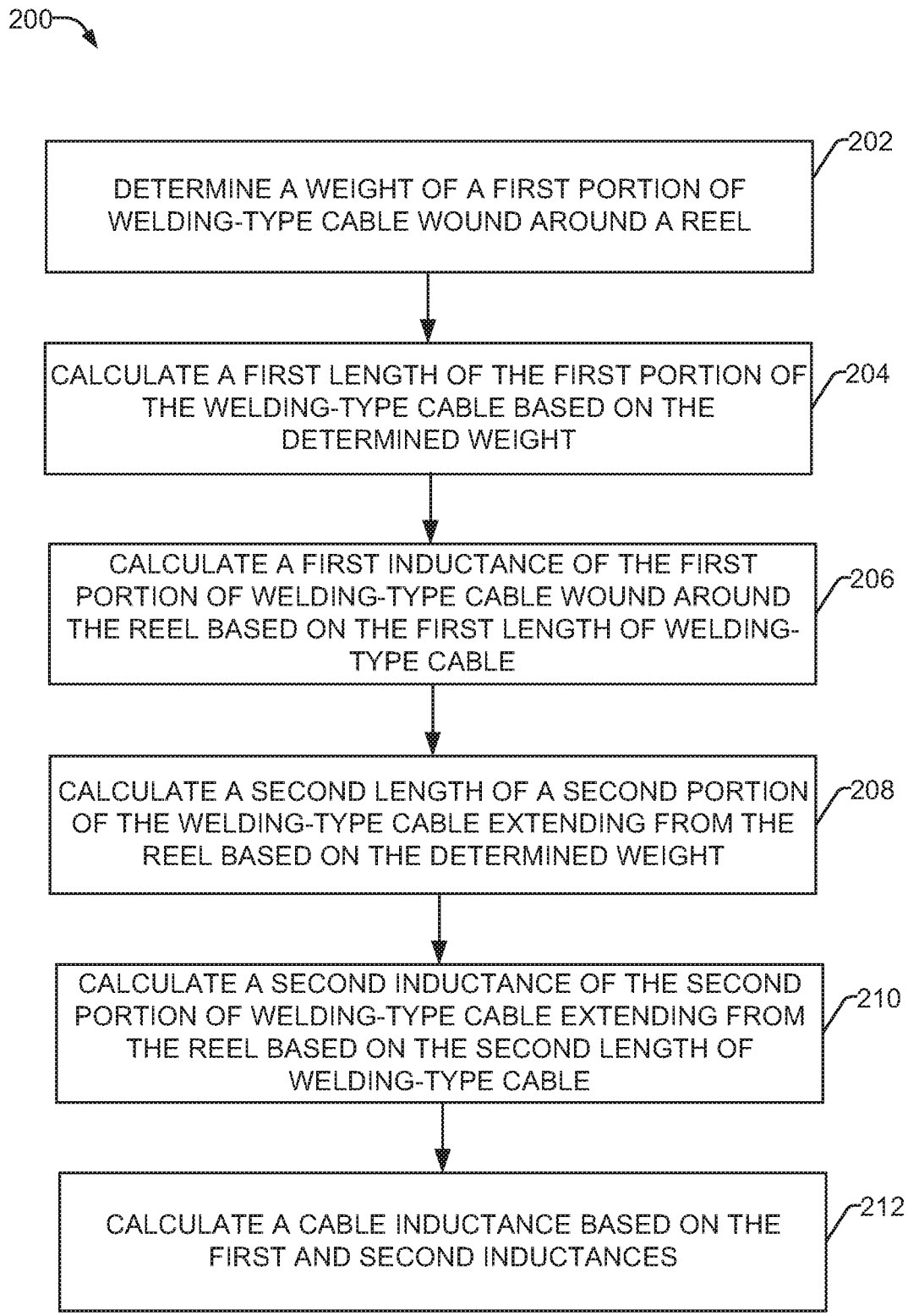
FIG. 5 illustrates another example method of calculating cable inductance in a welding-type system in accordance with aspects of this disclosure.

FIG. 5 is a flowchart representative of example machine readable instructions 200 which may be executed by the controller 110 of FIG. 3 to determine the inductance of a welding-type cable 104 and adjusting a welding type parameter of a welding type system 100, in accordance with the examples provided in FIGS. 1-3. At block 202, a weight of a first portion 108 of welding-type cable wound around a reel 102 is determined. At block 204, a first length of the first portion 108 of the welding-type cable based on the determined weight is calculated. At block 206, a first inductance of the first portion 108 of welding-type cable wound around the reel based on the first length of welding-type cable is calculated. At block 208, a second length of a second portion 106 of the welding-type cable extending from the reel 102 based on the determined weight is calculated. At block 210, a second inductance of the second portion 106 of welding-type cable extending from the reel 102 based on the second length of welding-type cable 104 is calculated. At block 212, a cable inductance based on the first and second inductances is calculated.

The present methods and systems may be realized in hardware, software, and/or a combination of hardware and software. Example implementations include an application specific integrated circuit and/or a programmable control circuit.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply comprising:
    a welding-type cable;
    a reel configured to wind the welding-type cable to reduce a first portion of the welding-type cable extending from the reel, and to unwind to increase the first portion of the welding-type cable extending from the reel, wherein a second portion of the welding-type cable is at least partially wound around the reel when stored, wherein the welding-type cable includes either (1) a power-return work cable or (2) at least one power conductor configured to deliver power to a welding-type tool; and
    a controller configured to:
    determine a first length of the first portion of the welding-type cable;
    calculate a first inductance of the first portion of the welding-type cable extending from the reel based on the first length;
    determine a second length of the second portion of the welding-type cable;
    calculate a second inductance of the second portion of the welding-type cable wound around the reel based on the second length; and
    calculate a cable inductance of the welding-type cable based on the first inductance and the second inductance.

2. The welding-type power supply as defined in claim 1, wherein the controller is further configured to:
    access a memory device that includes a plurality of values that associates a length of a cable wound around a reel with corresponding inductance values; and
    determine the second inductance by looking up the determined second length of the second portion of the welding-type cable in the memory device.

3. The welding-type power supply of claim 1, wherein the controller is further configured to control a welding parameter of the welding-type power supply based on the calculated cable inductance of the welding-type cable.

4. The welding-type power supply of claim 1, further comprising a sensor to measure the first length of the first portion of the welding-type cable extending from the reel.

5. The welding-type power supply of claim 4, wherein the controller is further configured to calculate the second length of the second portion of the welding-type cable wound around the reel based on the first length of the first portion of the welding-type cable extending from the reel and a total length of the welding-type cable.

6. The welding-type power supply as defined in claim 4, wherein the sensor is one of a digital or an analog rotary encoder configured to count a number of revolutions of the reel during winding and unwinding of the welding-type cable.

7. The welding-type power supply as defined in claim 4, wherein the sensor is a mechanical length measuring meter configured to measure the first length of the first portion of the welding-type cable during winding and unwinding of the welding-type cable.

8. The welding-type power supply as defined in claim 1, wherein the controller is further configured to:
    access a memory device that includes a plurality of values that associates inductance with corresponding welding parameters or welding system parameters; and
    determine a welding parameter or welding system parameter by looking up the calculated cable inductance in the memory device.

9. The welding-type power supply as defined in claim 8, wherein the controller is further configured to:
    identify a value of the determined welding parameter or welding system parameter based on the calculated cable inductance;
    compare the identified value to a desired value of the welding parameter or welding system parameter; and
    adjust a value of the welding parameter or welding system parameter based on the comparison.

10. The welding-type power supply as defined in claim 9, wherein the welding parameter is one of a voltage or a current.

11. A welding-type power supply comprising:
a welding-type cable;
a reel configured to manage the welding-type cable having a known fixed length such that a first portion of the welding-type cable is extended from the reel and a second portion of the welding-type cable is at least partially wound around the reel,
wherein the reel is configured to wind the welding-type cable to reduce the first portion and to unwind to increase the first portion of the welding-type cable extending from the reel, and
wherein the welding-type cable comprises a power-return work cable;
a sensor configured to measure a first length of the first portion of the welding-type cable; and
a controller operably coupled to the sensor configured to:
determine the first length;
determine a first inductance of the first portion of the welding-type cable extending from the reel based on the first length;
determine a second length of the second portion of the welding-type cable based on the known fixed length and the first length;
determine a second inductance of the second portion of the welding-type cable wound around the reel based on the second length; and
calculate a cable inductance of the welding-type cable based on the first inductance and the second inductance.

12. The welding-type power supply of claim 11, wherein the sensor is an optical sensor configured to read one or more markings positioned on an exterior surface of the welding-type cable.

13. The welding-type power supply of claim 11, wherein the sensor is a rotary encoder configured to count a number of revolutions of the reel during winding and unwinding of the welding-type cable relative to the reel.

14. The welding-type power supply of claim 11, wherein the controller is further configured to:
access a memory device that includes a plurality of values that associates a length of the second portion wound around a reel with corresponding inductance values; and
determine the second inductance by looking up the determined second length of the second portion of the welding-type cable in the memory device.

15. The welding-type power supply of claim 11, wherein the controller is further configured to control a welding parameter of the welding-type power supply based on the calculated cable inductance of the welding-type cable.

16. The welding-type power supply of claim 15, wherein the welding parameter is one of a voltage or a current.

17. The welding-type power supply of claim 11, wherein the controller is further configured to access a memory device that includes the known fixed length.

18. A welding-type power supply comprising:
a welding-type cable;
a reel configured to manage the welding-type cable having a known fixed length such that a first portion of the welding-type cable is extended from the reel and a second portion of the welding-type cable is at least partially wound around the reel,
wherein the reel is configured to wind the welding-type cable to reduce the first portion and to unwind to increase the first portion of the welding-type cable extending from the reel, and
wherein the welding-type cable comprises at least one power conductor configured to deliver power to a welding-type tool;
a sensor configured to measure a first length of the first portion of the welding-type cable; and
a controller operably coupled to the sensor configured to:
determine the first length;
determine a first inductance of the first portion of the welding-type cable extending from the reel based on the first length;
determine a second length of the second portion of the welding-type cable based on the known fixed length and the first length;
determine a second inductance of the second portion of the welding-type cable wound around the reel based on the second length; and
calculate a cable inductance of the welding-type cable based on the first inductance and the second inductance.

19. The welding-type power supply of claim 18, wherein the controller is further configured to:
access a memory device that includes a plurality of values that associates a length of the second portion wound around a reel with corresponding inductance values; and
determine the second inductance by looking up the determined second length of the second portion of the welding-type cable in the memory device.

20. The welding-type power supply of claim 19, wherein the controller is further configured to control a welding parameter of the welding-type power supply based on the calculated cable inductance of the welding-type cable.

* * * * *